United States Patent
Nakajima

[11] Patent Number: 5,814,542
[45] Date of Patent: Sep. 29, 1998

[54] FABRICATION METHOD OF SEMICONDUCTOR DEVICE WITH MOSFET AND CAPACITOR HAVING LOWER AND UPPER POLYSILICON REGIONS

[75] Inventor: Chika Nakajima, Tokyo, Japan

[73] Assignee: NEC Corporation, Tokyo, Japan

[21] Appl. No.: 781,811

[22] Filed: Jan. 9, 1997

[30] Foreign Application Priority Data

Jan. 9, 1996 [JP] Japan .................................. 8-001145

[51] Int. Cl.$^6$ ............................ H01L 21/70; H01L 27/00
[52] U.S. Cl. ............................................ 438/250; 438/251
[58] Field of Search .................................. 437/47, 48, 52, 437/60, 919; 438/238–239, 250–251, 393–394

[56] References Cited

U.S. PATENT DOCUMENTS 5,429,972  7/1995  Anjum et al. ............................ 437/47
5,610,094  3/1997  Ozaki et al. ............................ 437/62

FOREIGN PATENT DOCUMENTS 3-156929  7/1991  Japan .

*Primary Examiner*—Jey Tsai
*Attorney, Agent, or Firm*—Foley & Lardner

[57] ABSTRACT

A fabrication method of a semiconductor device that makes it possible to reduce the number of necessary process steps. After an insulating layer is formed on a semiconductor substructure, a polysilicon layer is formed on the insulating layer. Then, dopant atoms are implanted into the polysilicon layer so that the peak depth of the distribution of the implanted dopant atoms is located at approximately the middle level of the polysilicon layer. The implanted polysilicon layer is subjected to a heat-treatment to thereby form a dielectric region at the middle level of the polysilicon layer due to reaction of the implanted dopant atoms with silicon atoms existing in the polysilicon layer. The remaining lower and upper parts of the polysilicon layer form lower and upper polysilicon regions, respectively. Subsequently, the implanted and heat-treated polysilicon layer is patterned to have a predetermined shape. As the dopant atom to be implanted, oxygen (O) and/or nitrogen (N) is preferably used. The dielectric region is made of $SiO_x$ for oxygen only, of $SiN_x$ for nitrogen only, and of $SiNO_x$ for the combination of oxygen and nitrogen, where $0 < x < 1$.

9 Claims, 4 Drawing Sheets

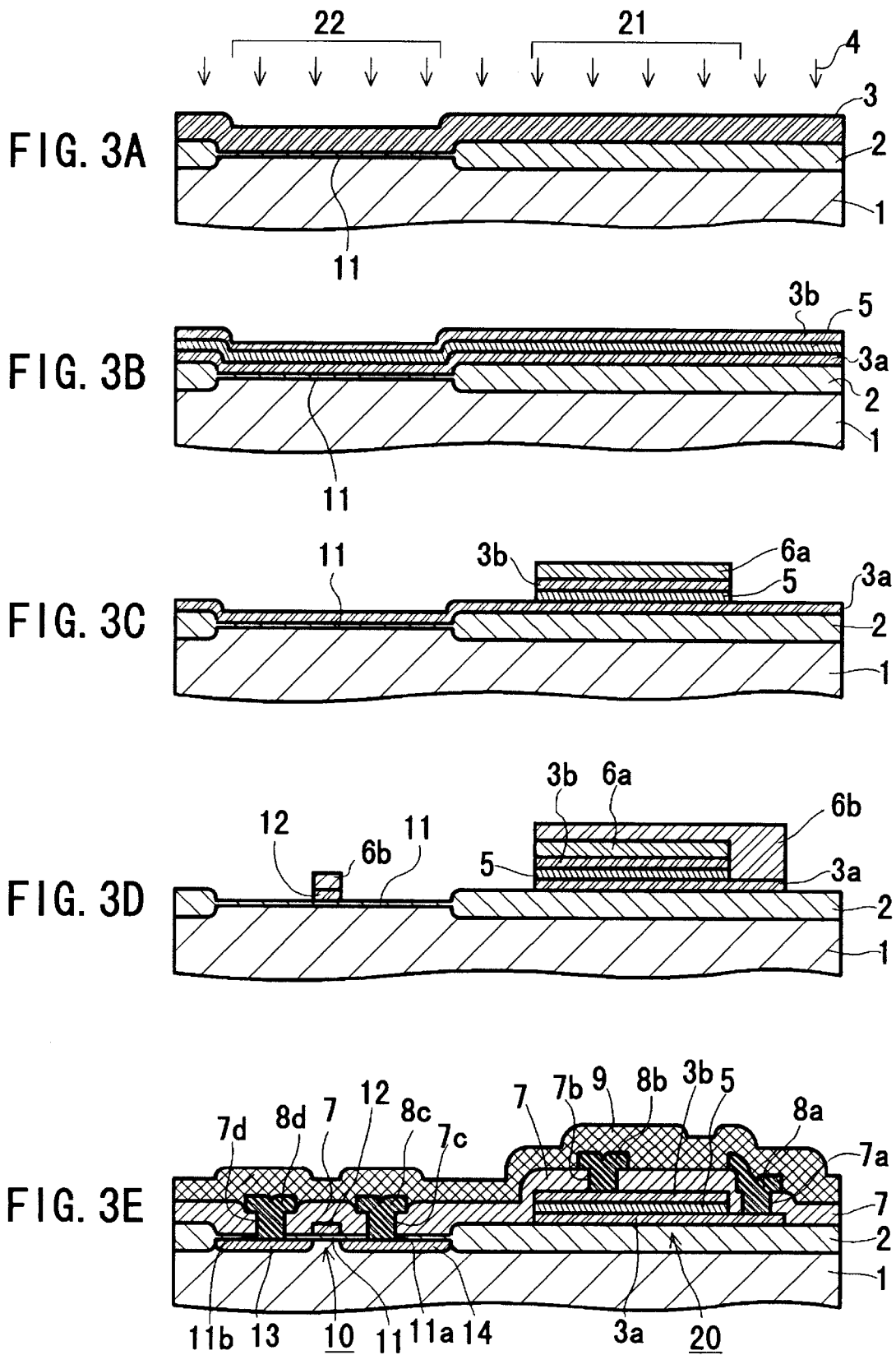

FABRICATION METHOD OF SEMICONDUCTOR DEVICE WITH MOSFET AND CAPACITOR HAVING LOWER AND UPPER POLYSILICON REGIONS

BACKGROUND OF THE INVENTION

1. Field of the Invention

The present invention relates to a semiconductor device and more particularly, to a fabrication method of a semiconductor device including a capacitor which is formed with the use of polysilicon.

2. Description of the Prior Art

A conventional fabrication method of a semiconductor device of this sort is shown in FIGS. 1A to 1F.

It is needless to say that this semiconductor device has capacitors in addition to active components such as bipolar transistors and/or Field-Effect Transistors (FETs). However, only one of the capacitors is explained here for the sake of simplification of description.

First, as shown in FIG. 1A, an isolation insulating layer 102 is formed on a main surface of a semiconductor substrate 101 by a thermal oxidation process. Then, a first polysilicon layer 103a with a thickness of approximately 2500 Å is formed on the isolation insulating layer 102 by a plasma-enhanced Chemical Vapor Deposition (CVD) process. The state at this stage is shown in FIG. 1A.

Next, a first photoresist film 106a is formed on the polysilicon layer 103a and patterned. Using the patterned photoresist film 106a as a mask, the first polysilicon layer 103a is selectively etched to thereby remove its unnecessary part. The state at this stage is shown in FIG 1B. Subsequently, the remaining polysilicon layer 103a is thermally oxidized to thereby form a silicon dioxide ($SiO_2$) layer 105 in the peripheral part of the layer 103a, as shown in FIG. 1C.

A second polysilicon layer 103b with a thickness of approximately 1500 Å is then deposited to cover the $SiO_2$ layer 105 thus formed and the exposed isolation insulating layer 102 by a plasma-enhanced CVD process. The state at this stage is shown in FIG. 1D.

A second photoresist film 106b is formed on the second polysilicon layer 103b thus deposited and patterned. Using the patterned photoresist film 106b as a mask, the second polysilicon layer 103b and the $SiO_2$ layer 105 are selectively etched to thereby remove their unnecessary parts. At this stage, the $SiO_2$ layer 105 is sandwiched by the first and second polysilicon layers 103a and 103b and the first polysilicon layer 103a is partially exposed from the $SiO_2$ layer 105 and the second polysilicon layer 103b, as shown in FIG. 1E.

The first and second polysilicon layers 103a and 103b serve as lower and upper electrodes of the capacitor, respectively, and the $SiO_2$ layer 105 serves as a dielectric of the capacitor.

Subsequently, an interlayer insulating layer 107 with a thickness of approximately 1.0 μm is formed to cover the entire substrate 101 by a CVD process. The layer 107b is then patterned by photolithography and etching processes to have contact holes 107a and 107b. As shown in FIG. 1F, the hole 107a exposes the remaining first polysilicon layer 103a, and the hole 107b exposes the remaining second polysilicon layer 103b.

An aluminum (Al) layer is formed on the interlayer insulating layer 107 by a sputtering process. Then, the Al layer is patterned by known processes to thereby form wiring layers 108a and 108b of the capacitor. The wiring layer 106a is contacted with the first polysilicon layer 103a and the contact region 108b is contacted with the second polysilicon layer 103b, as shown in FIG. 1F.

Finally, a passivation layer 109 is formed by a plasma-enhanced CVD process to cover the wiring layers 108a and 108b and the exposed interlayer insulating layer 107 over the entire substrate 101. Thus, the conventional semiconductor device with the capacitor is finished, as shown in FIG. 1F.

With the conventional fabrication method of the semiconductor device as shown in FIGS. 1A to 1F, to form the capacitor, the first and second polysilicon layers 103a and 103b are necessarily formed. Therefore, a problem that the number of the necessary fabrication process steps of the semiconductor device is large occurs.

SUMMARY OF THE INVENTION

Accordingly, an object of the present invention is to provide a fabrication method of a semiconductor device that is able to reduce the number of the necessary fabrication process steps.

Another object of the present invention is to provide a fabrication method of a semiconductor device that is able to form a capacitor with the use of a single formation process of a polysilicon layer.

A fabrication method of a semiconductor device according to the present invention includes the following steps:

A first step is to form an insulating layer on a semiconductor substructure.

A second step is to form a polysilicon layer on the insulating layer.

A third step is to implant dopant atoms into the polysilicon layer so that the peak depth of the distribution of the implanted dopant atoms is located at approximately the middle level of the polysilicon layer.

A fourth step is to perform a heat-treatment to the implanted polysilicon layer, thereby forming a dielectric region at approximately the middle level of the polysilicon layer due to reaction of the implanted dopant atoms with silicon atoms existing in the polysilicon layer. The remaining lower and upper parts of the polysilicon layer form lower and upper polysilicon regions, respectively.

A fifth step is to pattern the implanted and heat-treated polysilicon layer to have a predetermined shape.

With the fabrication method of a semiconductor device according to the present invention, the polysilicon layer is implanted with the dopant atoms so that the peak depth of the distribution of the implanted dopant atoms is located at approximately the middle level of the polysilicon layer. Then, the implanted polysilicon layer is heat-treated to thereby form the dielectric region at approximately the middle level of the polysilicon layer due to reaction of the implanted dopant atoms with silicon atoms existing in the polysilicon layer. This dielectric region serves as a dielectric of a capacitor.

Further, through the above heat-treatment process, the lower and upper polysilicon regions are formed by the remaining lower and upper parts of the polysilicon layer, respectively. The lower and upper polysilicon regions serve as lower and upper electrodes of the capacitor, respectively.

Therefore, a capacitor configuration is obtained by the dielectric region and the lower and upper polysilicon regions. As a result, the capacitor is able to be formed with the use of a single formation process of a polysilicon layer. This means that the number of necessary fabrication process steps of the semiconductor device is able to be reduced.

The semiconductor substructure typically includes a semiconductor substrate, and active and/or passive components formed in, on or, over the substrate.

The polysilicon layer may be doped with an n- or p-type dopant, and may be doped with no impurity.

As the dopant atom to be implanted, oxygen (O) and/or nitrogen (N) is preferably use. When oxygen is used only, the dielectric region is made of silicon dioxide ($SiO_x$) where $0<x<1$. When nitrogen is used only, the dielectric region is made of silicon nitride ($SiN_x$). When both of oxygen and nitrogen are used, the dielectric region is made of silicon oxynitride ($SiNO_x$).

In a preferred embodiment of the method according to the present invention, the substructure has an active region, and the insulating layer has an opening through which the active region is exposed. The polysilicon layer is formed to be overlapped with the active region so that the lower polysilicon region is contacted with the active region through the opening.

In this case, because the lower polysilicon region is directly connected to the active region, an additional advantage that the wiring or interconnection configuration of the capacitor is simplified arises.

BRIEF DESCRIPTION OF THE DRAWINGS

In order that the present invention may be readily carried into effect, it will now be described with reference to the accompanying drawings.

FIGS. 3A to 3E are cross-sectional views showing the process step sequence of a fabrication method of a semiconductor device according to a second embodiment of the invention, respectively.

DETAILED DESCRIPTION OF THE PREFERRED EMBODIMENTS

Figure 1A:
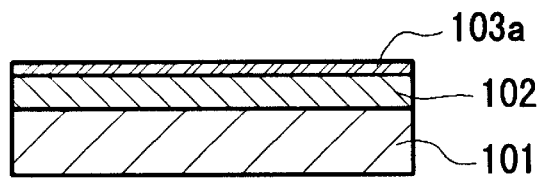
FIGS. 1A to 1F are cross-sectional views showing the process step sequence of a conventional fabrication method of a semiconductor device, respectively.
Figure 1B:
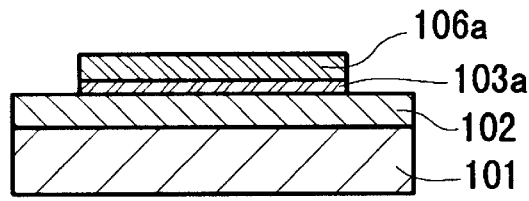
Figure 1C:
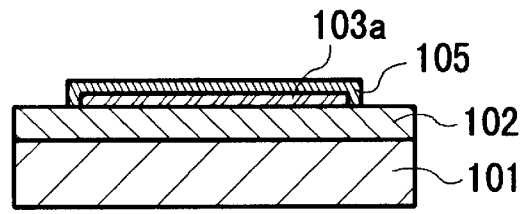
Figure 1D:
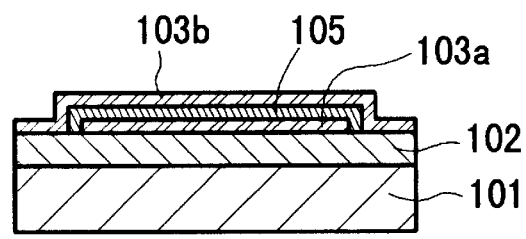
Figure 1E:
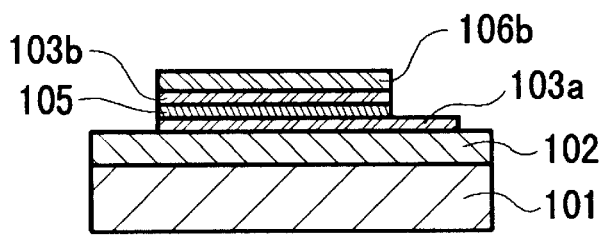
Figure 1F:
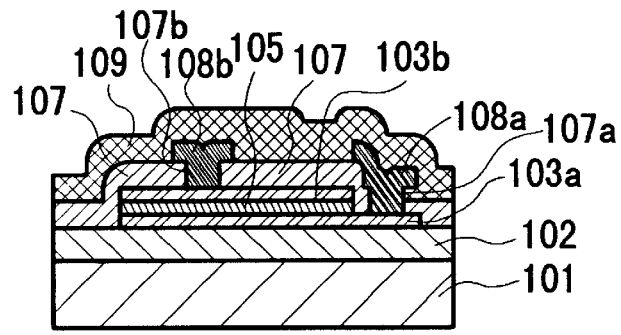

Preferred embodiments of the present invention will be described below referring to the drawings attached.

FIRST EMBODIMENT

A fabrication method of a semiconductor device according to a first embodiment of the present invention is shown in FIGS. 2A to 2E. Although this semiconductor device has a plurality of capacitors, only one of the capacitors is explained here for the sake of simplification of description.

Figure 2A:
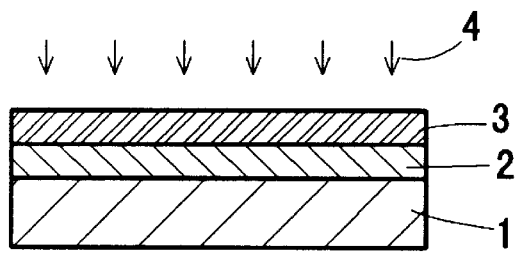
FIGS. 2A to 2E are cross-sectional views showing the process step sequence of a fabrication method of a semiconductor device according to a first embodiment of the invention, respectively.

First, as shown in FIG. 2A, an isolation insulating layer 2 of $SiO_2$ with a thickness of 1.0 μm is selectively formed on a main surface of a semiconductor substrate 1 by, for example, a wet thermal oxidation process at a temperature of 980° C. for 480 minutes.

Then, a polysilicon layer 3 with a thickness of 5000 Å is formed on the isolation insulating layer 2 by a plasma-enhanced CVD process. To form a dielectric layer for a capacitor, the polysilicon layer 3 thus formed is implanted with oxygen ions ($O^{2-}$) 4 at an acceleration energy of 100 keV to 150 keV with a dose of $1\times10^{15}$ to $1\times10^{18}$ atoms/cm$^2$. The peak depth of the distribution of the implanted oxygen ions is 2500 Å from the top surface of the polysilicon layer 3, which is located at the central level of the layer 3. The state at this stage is shown in FIG. 2A.

The ion-implanted polysilicon layer 3 is subjected to a heat-treatment at a temperature of 900° C. for 80 to 100 minutes. Through this heat-treatment process, the implanted oxygen atoms are reacted with the silicon atoms existing in the polysilicon layer 3, resulting in a dielectric region 5 made of silicon dioxide ($SiO_2$) in the layer 3.

The value of the acceleration energy is determined so that the peak depth of the distribution of the implanted oxygen ions is located at the central level of the polysilicon layer 3. The value of the dose is determined corresponding to the number of the Si atoms existing in the polysilicon layer 3, thereby generating the wanted dielectric region 5 of $SiO_2$. The condition of the heat-treatment is determined so as to generate the wanted dielectric region 5 of $SiO_2$.

Figure 2B:
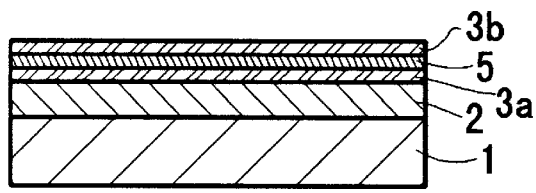

As shown in FIG. 2B, the dielectric region 5 thus generated extends horizontally along the polysilicon layer 3 and is located at the middle level of the layer 3. The lower and upper region 3a and 3b of the polysilicon layer 3 are not reacted and are left substantially unchanged. Therefore, lower and upper polysilicon regions 3a and 3b are formed at the lower and upper levels in the polysilicon layer 3, respectively. The lower and upper polysilicon layer 3. In other words, the polysilicon regions 3a and 3b are parallel to the $SiO_2$ region 5.

Figure 2C:
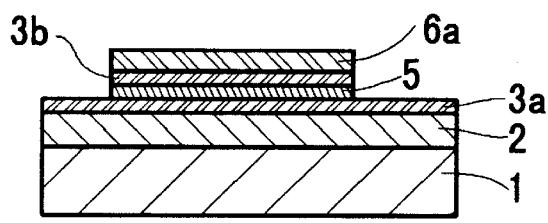

Further, a first photoresist film 6a is formed on the polysilicon layer 103 and is patterned. Using the patterned photoresist film 6a as a mask, the upper polysilicon region 3a and the dielectric region 5 are selectively etched to remove their unnecessary parts, thereby obtaining predetermined plan shapes. Through this etching process, the lower polysilicon region 3a is partially exposed from the upper polysilicon region 3a and the dielectric region 5. The state at this stage is shown in FIG. 2C.

Figure 2D:
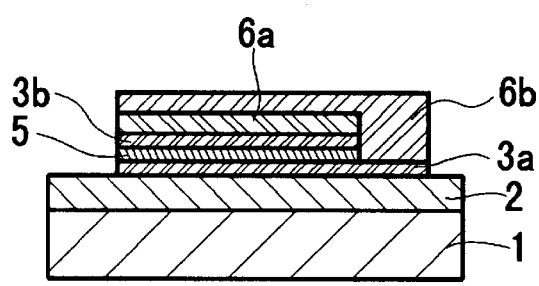

A second photoresist film 6b is formed on the upper polysilicon region 3b and the exposed lower polysilicon region 3a without removing the patterned photoresist film 6a from the upper polysilicon region 3b, and is then patterned. Using the patterned photoresist film 6b as a mask, the lower polysilicon region 3b is selectively etched to remove its unnecessary part, thereby obtaining a predetermined plan shape. The remaining insulating layer 2 is selectively exposed from the lower polysilicon region 3a. The state at this stage is shown in FIG. 2D.

After removing the patterned photoresist films 6a and 6b, an interlayer insulating layer 7 with a thickness of approximately 1.0 μm is then formed on the remaining, patterned polysilicon layers and the exposed insulating layer 2 over the entire substrate 1. The interlayer insulating layer 7 is then patterned by photolithography and etching processes to have a contact hole 7a extending to the lower polysilicon region 3a and a contact hole 7b extending to the upper polysilicon region 3b, as shown in FIG. 2E.

Further, an aluminum (Al) layer is formed by a sputtering process on the patterned interlayer insulating layer 7, and is patterned to remove its unnecessary part. Thus, a wiring layer 8a contacted with the lower polysilicon region 3a through the contact hole 7a and a wiring layer 8b contacted with the upper polysilicon region 3b through the contact hole 7b are formed, as shown in FIG. 2E.

Finally, a passivation layer 9 with a thickness of approximately 1.0 μm is formed by a plasma-enhanced CVD process to cover the entire substrate 1.

Figure 2E:
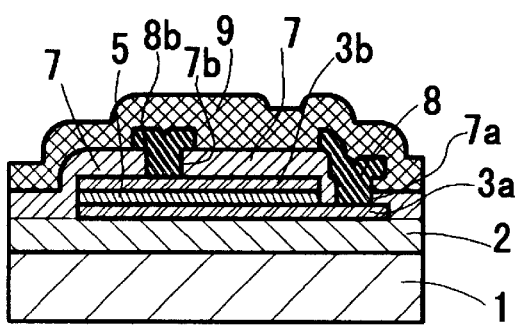

Thus, the semiconductor device with the capacitor as shown in FIG. 2E is obtained, in which the dielectric region 5 serves as a dielectric of the capacitor, and the lower and upper polysilicon regions 3a and 3b serve as a pair of electrodes thereof, respectively.

With the fabrication method of the semiconductor device according to the first embodiment, the polysilicon layer 3 is ion-implanted with the oxygen ions and is then heat-treated, thereby forming the dielectric region 5 located at the middle level of the polysilicon layer 3. The remaining lower and upper parts of the polysilicon layer 3 form the lower and upper polysilicon regions 3a and 3b, respectively.

The dielectric region 5 serves as a dielectric of the capacitor, and the lower and upper polysilicon regions 3a and 3b serve as lower and upper electrodes of the capacitor, respectively.

Therefore, the capacitor is able to be formed with the use of a single formation process of the polysilicon layer 3. This means that the number of necessary fabrication process steps of the semiconductor device is able to be reduced.

The testing performed by the inventor represented that the capacitor thus formed is able to have a capacitance of $200 \times 10^{-18}$ to $700 \times 10^{-18}$ F/$\mu$m$^2$ (=0.2 to 0.7 fF/$\mu$m$^2$).

SECOND EMBODIMENT

A fabrication method of a semiconductor device according to a second embodiment of the present invention is shown in FIGS. 3A to 3E. Although this semiconductor device has a plurality of Metal-Oxide-Semiconductor (MOS) FETs (MOSFETs) and a plurality of capacitors, only one of the MOSFETs and only one of the capacitors are explained here for the sake of simplification of description.

The semiconductor device fabricated by the method according to the second embodiment is equivalent to the combination of the semiconductor device fabricated by the method according to the first embodiment and an MOSFET.

First, a silicon nitride ($Si_3N_4$) layer (not shown) is selectively formed on a main surface of a semiconductor substrate 1. Then, using the $Si_3N_4$ layer as a mask, an isolation insulating layer 2 made of $SiO_2$ with a thickness of 1.0 $\mu$m is formed on the main surface of the substrate 1 by, for example, a wet thermal oxidation process at a temperature of 980° C. for 480 minutes, as shown in FIG. 3A. Thus, MOSFET region 22, in which the main surface of the substrate 1 is exposed from the insulating layer 2, is defined on the substrate 1. A resistor region 21 is located on the insulating layer 2.

After removing the $Si_3N_4$ layer, a thin gate oxide layer 11 made of $SiO_2$ is selectively formed on the exposed main surface of the substrate 1 in the MOSFET region 22 by a thermal oxidation process, as shown in FIG. 3A.

Then, a polysilicon layer 3 with a thickness of 5000 Å is formed on the isolation insulating layer 2 and the gate oxide layer 11 over the entire substrate 1 by a plasma-enhanced CVD process. To form a dielectric layer of the capacitor, the polysilicon layer 3 thus formed is entirely implanted with oxygen ions ($O^{2-}$) 4 at an acceleration energy of 100 to 150 keV with a dose of $1 \times 10^{15}$ to $1 \times 10^{18}$ atoms/cm$^2$. The peak depth of the distribution of the implanted oxygen ions is 2500 Å from the top surface of the polysilicon layer 3, which is located at the central level of the layer 3. The state at this stage is shown in FIG. 3A.

The ion-implanted polysilicon layer 3 is then subjected to a heat-treatment process at a temperature of 900° C. for 80 to 100 minutes. Through this heat-treatment process, the implanted oxygen atoms react with the silicon (Si) atoms existing in the polysilicon layer 3, resulting in a dielectric region 5 made of $SiO_2$ in the layer 3.

As shown in FIG. 3B, the dielectric region 5 thus generated extends horizontally along the polysilicon layer 3 over the entire substrate 1, and is located at the central level of the layer 3. The lower and upper parts of the layer 3 are not reacted to be left unchanged, thereby generating lower and upper polysilicon regions 3a and 3b at the lower and upper levels in the polysilicon layer 3, respectively. The lower and upper polysilicon regions 3a and 3b extend horizontally along the polysilicon layer 3 over the entire substrate 1.

The above process steps are substantially the same as those of the first embodiment.

Further, a first photoresist film 6a is formed on the ion-implanted and heat-treated polysilicon layer 3, and is patterned. Using the patterned first photoresist film 6a as a mask, the upper polysilicon region 3a and the dielectric region 5 are selectively etched to remove their unnecessary parts, thereby having predetermined plan shapes. Thus, the lower polysilicon region 3a is partially exposed from the upper polysilicon region 3a and the dielectric region 5 in the resistor region 21. On the other hand, the lower polysilicon region 3a is entirely exposed from the upper polysilicon region 3a and the dielectric region 5 in the MOSFET region 22. The state at this stage is shown in FIG. 3C.

A second photoresist film 6b is formed to cover the remaining upper polysilicon region 3b and the exposed lower polysilicon region 3a without removing the patterned photoresist film 6a, and is patterned. Using the patterned second photoresist film 6b as a mask, the lower polysilicon region 3b is selectively etched to remove its unnecessary parts, thereby having a predetermined plan shape.

Thus, the remaining lower polysilicon region 3a is partially exposed from the upper polysilicon region 3b and the dielectric region 5 in the resistor region 21. The remaining lower and upper polysilicon regions 3a and 3b serve as lower and upper electrodes of the capacitor 20, and the dielectric layer 5 serves as a dielectric of the capacitor 20 in the resistor region 21. At the same time, the remaining lower polysilicon region 3a in the MOSFET region 22 serves as a gate electrode 12 of the MOSFET 10. The state at this stage is shown in FIG. 3D.

After removing the first and second photoresist films 6a and 6b, using the isolation insulating layer 2 and the gate electrode 12 as a mask, suitable dopant ions are selectively implanted into the substrate 1 through the gate oxide layer 11 in the MOSFET region 22. Thus, a pair of source/drain regions 13 and 14 are formed at each side of the gate electrode 12 in the substrate 1. Thus, the MOSFET 10 is obtained.

Subsequently, an interlayer insulating layer 7 with a thickness of approximately 1.0 $\mu$m is deposited on the remaining, patterned polysilicon layers, the exposed gate oxide layer 11, and the exposed insulating layer 2 over the entire substrate 1.

The interlayer insulating layer 7 thus deposited and the underlying gate oxide layer 11 are then patterned by photolithography and etching processes to have contact holes 7a, 7b, 7c, and 7d. The contact hole 7a extends through the isolation insulating layer 7 to the lower polysilicon region 3a in the resistor region 21. The contact hole 7b extends through the isolation insulating layer 7 to the upper polysilicon region 3b in the resistor region 21. The contact hole 7c extends through the isolation insulating layer 7 and the gate oxide layer 11 to the source/drain region 14 in the MOSFET region 22. The contact hole 7d extends through the isolation insulating layer 7 and the gate oxide layer 11 to the source/drain region 13 in the MOSFET region 22.

Further, an aluminum layer is formed by a sputtering process on the patterned interlayer insulating layer 7, and is patterned by photolithography and etching processes to remove its unnecessary part. Thus, wiring layers 8a and 8b for the capacitor 20 and wiring layers 8c and 8d for the MOSFET 10 are formed. The wiring layer 8a is contacted with the lower polysilicon region 3a through the contact hole 7a. The wiring layer 8b is contacted with the upper polysilicon region 3b through the contact hole 7b. The wiring layer 8c is contacted with the source/drain region 14 through the contact hole 7c. The wiring layer 8d is contacted with the source/drain region 13 through the contact hole 7d.

Finally a passivation layer 9 with a thickness of approximately 1.0 μm is formed on the wiring layers 8a, 8b, 8c, and 8d and the exposed interlayer insulating layer 7 by a plasma-enhanced CVD process to cover the entire substrate 1.

Thus, the semiconductor device with the MOSFET 10 and the capacitor 10 as shown in FIG. 3E is obtained.

With the fabrication method of the semiconductor device according to the second embodiment, because of the same reason as that of the first embodiment, the capacitor 20 is able to be formed with the use of a single formation process of the polysilicon layer 3. This makes it possible to reduce the number of necessary fabrication process steps of the semiconductor device.

In this embodiment, the same capacitance as that of the first embodiment, i.e., $200 \times 10^{-15}$ to $700 \times 10^{-18}$ F/$\mu m^2$ (=0.2 to 0.7 fF/$\mu m^2$), can be realized.

THIRD EMBODIMENT

A fabrication method of a semiconductor device according to a third embodiment of the present invention is shown in FIGS. 3A to 3E. Similar to the second embodiment, this semiconductor device has a plurality of MOSFETs and a plurality of capacitors. However, only one of the MOSFETs and only one of the capacitors are explained here for the sake of simplification of description.

The method according to the third embodiment is equivalent to a variation of the method according to the second embodiment.

Figure 4A:
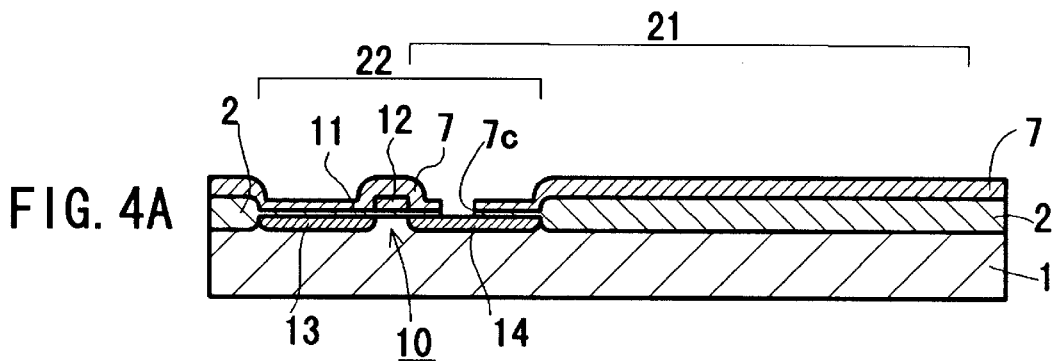
FIGS. 4A to 4D are cross-sectional views showing the process step sequence of a fabrication method of a semiconductor device according to a third embodiment of the invention, respectively.

First, a $Si_3N_4$ layer (not shown) is selectively formed on a main surface of a semiconductor substrate 1. Then, using the $Si_3N_4$ layer as a mask, an isolation insulating layer 2 made of $SiO_2$ with a thickness of 1.0 μm is formed on the main surface of the substrate 1 by, for example, a wet thermal oxidation process at a temperature of 980° C. for 480 minutes, as shown in FIG. 4A. Thus, an MOSFET region 22, in which the main surface of the substrate 1 is exposed from the insulating layer 2, is defined on the substrate 1. A resistor region 21 is located on the insulating layer 2 and is partially overlapped with the MOSFET region 22, which is different from the first embodiment.

After removing the $Si_3N_4$ layer, a thin gate oxide layer 11 made of $SiO_2$ is selectively formed on the exposed main surface of the substrate 1 in the MOSFET region 22 by a thermal oxidation process, as shown in FIG. 4A.

Then, a polysilicon layer (not shown) with a thickness of approximately 1000 Å is deposited on the isolation insulating layer 2 and the gate oxide layer 11 over the entire substrate 1 by a plasma-enhanced CVD process. The polysilicon layer thus formed is patterned to thereby form a gate electrode 12 on the gate oxide layer 11 in the MOSFET region 22, as shown in FIG. 4A.

Using the gate electrode 12 and the isolation insulating layer 2 as a mask, suitable dopant ions are selectively implanted into the substrate 1, thereby forming a pair of source/drain regions 13 and 14 in the substrate 1. Thus, the MOSFET 10 is formed in the MOSFET region 22.

Following this, a first interlayer insulating layer 7 with a thickness of approximately 0.6 μm is deposited to cover the entire substrate 1. The layer 7 covers the isolation insulating layer 2 and the gate oxide layer 11. The first interlayer insulating layer 7 and the gate insulating layer 11 are then patterned by photolithography and etching processes to have a contact hole 7c extending to the underlying source/drain region 14 through the gate oxide layer 11. The state at this stage is shown in FIG. 4A.

Figure 4B:
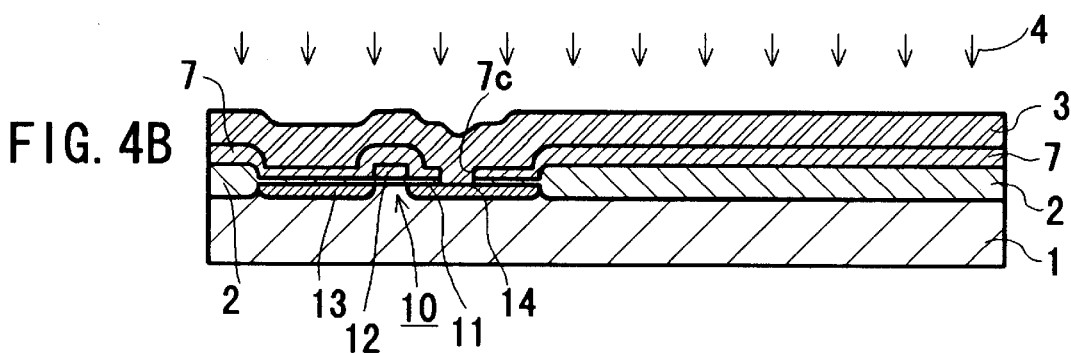

Next, a polysilicon layer 3 with a thickness of approximately 5000 Å is deposited to cover the entire substrate 1 by a plasma-enhanced CVD process. Then, to form a dielectric layer for the capacitor, the polysilicon layer 3 thus formed is entirely implanted with oxygen ions ($O^{2-}$) 4 at an acceleration energy of 100 to 150 keV with a does of $1 \times 10^{15}$ to $1 \times 10^{18}$ atoms/cm$^2$. The peak depth of the distribution of the implanted oxygen ions is 2500 Å from the top surface of the polysilicon layer 3, which is located at the central level of the layer 3. The state at this stage is shown in FIG. 4B.

The ion-implanted polysilicon layer 3 is then subjected to a Rapid Thermal Annealing (RTA) process at a temperature of 1050° C. for 5 seconds. Through this RTA process, the implanted oxygen atoms react with the silicon (Si) atoms existing in the polysilicon layer 3, resulting in a dielectric region 5 made of $SiO_2$ in the layer 3.

Figure 4C:
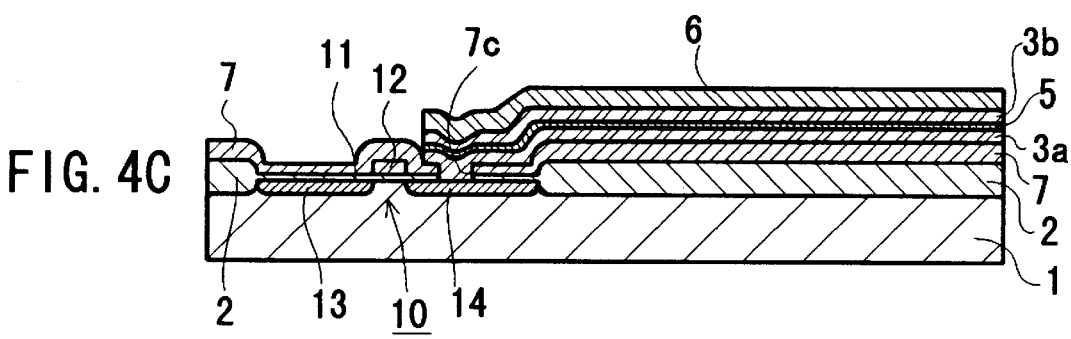

As shown in FIG. 4C, the dielectric region 5 thus generated extends horizontally along the polysilicon layer 3 over the entire substrate 1, and is located at the central level of the layer 3. The lower and upper parts of the layer 3 are not reacted to be left unchanged, thereby generating lower and upper polysilicon regions 3a and 3b at the lower and upper levels in the polysilicon layer 3, respectively. The lower and upper polysilicon regions 3a and 3b extend horizontally along the polysilicon layer 3 over the entire substrate 1. This is the same as that of the first and second embodiments.

Further, a photoresist film 6 is formed on the ion-implanted and annealed polysilicon layer 3, and is patterned. Using the patterned photoresist film 6 as a mask, the polysilicon layer 3 is selectively etched to remove its unnecessary part, thereby having a predetermined plan shape. Thus, the underlying first interlayer insulating layer 7 is partially exposed from the polysilicon layer 3 in the MOSFET region 22. The state at this stage is shown in FIG. 4C.

Subsequently, after removing the photoresist film 6, a second interlayer insulating layer 17 with a thickness of approximately 0.7 μm is deposited on the remaining, patterned polysilicon layers and the exposed first interlayer insulating layer 7 over the entire substrate 1. Then, the interlayer insulating layer 17 thus deposited, the insulating layer 7, and the gate oxide layer 11 are patterned by photolithography and etching processes to have contact holes 17a and 17d. The contact hole 17a extends through the second interlayer insulating layer 17 to the upper polysilicon region 3b in the resistor region 21. The contact hole 17d extends through the second and first interlayer insulating layers 17 and 7 to the source/drain region 13 in the MOSFET region 22.

Further, an aluminum layer is formed by a sputtering process on the patterned second interlayer insulating layer 17, and is patterned by photolithography and etching processes to remove its unnecessary part. Thus, a wiring layer 8b for the capacitor 20 and a wiring layer 8d for the MOSFET 10 are formed. The wiring layer 8b is contacted with the upper polysilicon region 3b through the contact hole 17a. The wiring layer 8d is contacted with the source/drain region 13 through the contact hole 17d.

Finally, a passivation layer 9 with a thickness of approximately 1.0 µm is formed on the wiring layers 8b and 8d and the exposed second interlayer insulating layer 17 by a plasma-enhanced CVD process to cover the entire substrate 1.

Figure 4D:
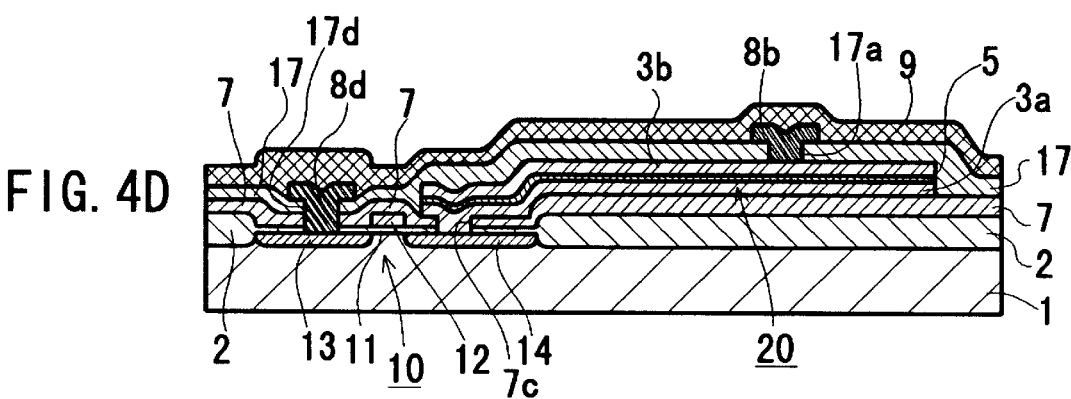

Thus, the semiconductor device with the MOSFET 10 and the capacitor 20 as shown in FIG. 4D is obtained.

With the fabrication method of the semiconductor device according to the third embodiment, because of the same reason as that of the first embodiment, the capacitor 20 is able to be formed with the use of a single formation process of the polysilicon layer 3. This makes it possible to reduce the number of necessary fabrication process steps of the semiconductor device.

In the method according to the third embodiment, because the lower polysilicon region 3a is directly contacted with the source/drain region 14 of the MOSFET 10, an additional advantage that the wiring or interconnection configuration of the capacitor 20 is simplified arises. Further, since the area of the capacitor 20 can be wider than that in the second embodiment, another additional advantage that the chip area can be more effectively used occurs.

Also in the third embodiment, the same capacitance as that of the first embodiment, i.e., $200 \times 10^{-18}$ to $700 \times 10^{-18}$ $F/\mu m^2$ (=0.2 to 0.7 $fF/\mu m^2$), can be realized.

In the above first to third embodiments, the MOSFET 10 is formed on the substrate 1. However, it is needless to say that any other active component such as a bipolar transistor may be used in the present invention.

Also, although oxygen ion is implanted into the polysilicon layer 3 in the first to third embodiments to generate the dielectric region 5, nitrogen ion may be used instead of oxygen ion. In this case, the dielectric region 5 is made of silicon nitride ($SiN_x$), where $0 < x < 1$.

Further, both of oxygen and nitrogen ions may be used simultaneously instead of oxygen ion. In this case, the dielectric region 5 is made of silicon oxynitride ($SiNO_x$).

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device with a MOSFET and a capacitor, comprising the steps of:

(a) preparing a semiconductor substructure;

(b) selectively forming an isolation insulating layer on a main surface of said substructure, thereby defining an active region for said MOSFET where said main surface is exposed from said isolation insulating layer;

(c) forming a gate insulating layer of said MOSFET on said exposed surface of said substructure in said active region;

(d) forming a polysilicon layer on said isolation insulating layer and said gate insulating layer;

(e) implanting dopant atoms into said polysilicon layer so that a peak depth of a distribution of said implanted dopant atoms is located at approximately a middle level of said polysilicon layer;

(f) performing a heat-treatment to said implanted polysilicon layer, thereby forming a dielectric region at approximately the middle level of said polysilicon layer due to reaction of said implanted dopant atoms with silicon atoms existing in said polysilicon layer;

remaining lower and upper parts of said polysilicon layer forming lower and upper polysilicon regions, respectively;

(g) patterning said implanted and heat-treated polysilicon layer to have a shape of said capacitor and a shape of a gate electrode of said MOSFET;

said capacitor being located on said isolation insulating layer, and said gate electrode being located on said gate insulating layer;

said gate electrode being formed by said remaining lower polysilicon region;

(h) selectively ion-implanting into said substructure through said gate insulating layer to thereby form a pair of source/drain regions at each side of said gate electrode in said active region;

(i) forming an interlayer insulating layer on said patterned polysilicon layer, said gate insulating layer, and said isolation insulating layer over said entire substructure;

(j) patterning said interlayer insulating layer and said gate insulating layer to have first, second, third and fourth contact holes;

said first contact hole extending to said lower polysilicon region;

said second contact hole extending to said upper polysilicon region;

said third and fourth contact holes extending to said pair of source/drain regions, respectively;

(k) forming a conductive layer on said patterned interlayer insulating layer;

said conductive layer being contacted with said lower and upper polysilicon regions through said first and second contact holes, and with said pair of source/drain regions through said third and fourth contact holes, respectively; and (l) patterning said conductive layer to have a shape;

wherein said dielectric region serves as a dielectric of said capacitor, and said lower and upper polysilicon regions serve as lower and upper electrodes of said capacitor, respectively.

2. A method as claimed in claim 1, wherein said implanted atoms are at least one selected from the group consisting of oxygen and nitrogen.

3. A method as claimed in claim 1, wherein said dielectric region is made of one selected from the group consisting of $SiO_2$, $SiN_x$, and $SiNO_x$, where x is greater than zero and less than unity.

4. A fabrication method of a semiconductor device with a MOSFET and a capacitor, comprising the steps of:

(a) preparing a semiconductor substructure;

(b) selectively forming an isolation insulating layer on a main surface of said substructure, thereby defining an active region for said MOSFET where said main surface is exposed from said isolation insulating layer;

(c) forming a gate insulating layer of said MOSFET on said exposed surface of said substructure in said active region;

(d) forming a gate electrode on said gate insulating layer;

(e) selectively ion-implanting into said substructure through said gate insulating layer to thereby form a pair of source/drain regions at each side of said gate electrode in said active region;

(f) forming a first interlayer insulating layer on said gate electrode, said exposed gate insulating layer, and said isolation insulating layer over said entire substructure;

(g) patterning said first interlayer insulating layer and said gate insulating layer to have a first contact hole;

said first contact hole extending through said first interlayer insulating layer and said gate insulating layer to a first source/drain region of said pair of source/drain regions;

(h) forming a polysilicon layer on said patterned first interlayer insulating layer;

(i) implanting dopant atoms into said polysilicon layer so that a peak depth of a distribution of said implanted dopant atoms is located at approximately a middle level of said polysilicon layer;

(j) performing a heat-treatment to said implanted polysilicon layer, thereby forming a dielectric region at approximately the middle level of said polysilicon layer due to reaction of said implanted dopant atoms with silicon atoms existing in said polysilicon layer;

remaining lower and upper parts of said polysilicon layer forming lower and upper polysilicon regions, respectively;

(k) patterning said implanted and heat-treated polysilicon layer to have a shape of said capacitor;

said capacitor being located on said first interlayer insulating layer;

said capacitor being partially overlapped with said active region so that said lower polysilicon region is contacted with said first source/drain region of said pair of source/drain regions through said contact hole;

(l) forming a second interlayer insulating layer on said patterned polysilicon layer and said exposed first interlayer insulating layer over said entire substructure;

(m) patterning said second and first interlayer insulating layers and said gate insulating layer to have second and third contact holes;

said second contact hole extending through said second interlayer insulating layer to said upper polysilicon region;

said third contact hold extending through said second and first interlayer insulating layers and said gate insulating layer to a second source/drain region of said pair of source/drain regions;

(n) forming a conductive layer on said patterned second interlayer insulating layer;

said conductive layer being contacted with said upper polysilicon region through said second contact hole, and with said second source/drain region through said third contact hole; and (o) patterning said conductive layer to have a shape;

wherein said dielectric region serves as a dielectric of said capacitor, and said lower and upper polysilicon regions serve as lower and upper electrodes of said capacitor, respectively.

5. A method as claimed in claim 4, wherein said implanted atoms are at least one selected from the group consisting of oxygen and nitrogen.

6. A method as claimed in claim 4, wherein said dielectric region is made of one selected from the group consisting of $SiO_x$, $SiN_x$, and $SiO_x$, where x is greater than zero and less than unity.

7. A fabrication method of a semiconductor device with a MOSFET and a capacitor, comprising the steps of:

(a) preparing a semiconductor substructure;

(b) forming a first insulating layer on a first portion of a top surface of said substructure, wherein a second portion of the top surface of said substructure in which said first insulating layer is not formed serves as a MOSFET region;

(c) forming a gate oxide layer on the second portion of the top surface of the substructure but not on the first portion of the top surface of the substructure;

(d) forming a polysilicon layer on the first and second portions of the top surface of the substructure;

(e) implanting dopant atoms into said polysilicon layer so that a peak depth of a distribution of said implanted dopant atoms is located at approximately a middle level of said polysilicon layer;

(f) performing a heat-treatment to said implanted polysilicon layer, thereby forming a dielectric region at approximately the middle level of said polysilicon layer due to reaction of said implanted dopant atoms with silicon atoms existing in said polysilicon layer, remaining lower and upper parts of said polysilicon layer forming lower and upper polysilicon regions, respectively;

(g) patterning said implanted and heat-treated polysilicon layer to have a shape, such that, in the first portion of the top surface of the substructure, the lower polysilicon region is partially exposed from the upper polysilicon region and the dielectric region, and such that, in the second portion of the top surface of the substructure, the lower polysilicon region is entirely exposed from the upper polysilicon layer and the dielectric region, wherein the lower and upper polysilicon regions in the first portion of the top surface of the substructure serve as lower and upper electrodes of said capacitor, respectively, and wherein the lower and upper polysilicon regions in the first portion of the top surface of the substructure serve as lower and upper electrodes of said capacitor, respectively, and wherein the lower polysilicon region in the second portion of the top surface of the substructure serves as a gate electrode of said MOSFET.

8. A method as claimed in claim 7, further comprising the steps of:

(h) implanting dopant atoms in the second region of the top surface of the substructure so as to form a first and a second source/drain region at each side of the gate electrode of said MOSFET;

(i) forming an interlayer insulating layer over said entire substructure;

(j) patterning said interlayer insulating layer to form first, second, third and fourth contact holes, wherein the first contact hole extends to said upper polysilicon region in the first portion of the top surface of the substructure, wherein the second contact hole extends to said lower polysilicon region in the first portion of the top surface of the substructure, wherein the third contact hole extends to the first source/drain region, and wherein the fourth contact hole extends to the second source/drain region.

9. A fabrication method of a semiconductor device with a MOSFET and a capacitor, comprising the steps of:

(a) preparing a semiconductor substructure;

(b) forming a first insulating layer on a first portion of a top surface of said substructure, wherein a second portion of the top surface of said substructure in which said first insulating layer is not formed serves as a MOSFET region;

(c) forming a gate oxide layer on the second portion of the top surface of the substructure but not on the first portion of the top surface of the substructure;

(d) forming a first polysilicon layer on the second portion of the top surface of the substructure;

(e) implanting dopant atoms into said first polysilicon layer to form a first and second source/drain region for said MOSFET;

(f) forming a first interlayer insulating layer over said entire substructure;

(g) patterning said first interlayer insulating layer to form a first contact hole to the second source/drain region;

(h) forming a second polysilicon layer over said entire substructure;

(i) implanting dopant atoms into said second polysilicon layer so that a peak depth of a distribution of said implanted dopant atoms is located at approximately a middle level of said polysilicon layer;

(j) performing a heat-treatment to said implanted second polysilicon layer, thereby forming a dielectric region at approximately the middle level of said second polysilicon layer due to reaction of said implanted dopant atoms with silicon atoms existing in said second polysilicon layer, remaining lower and upper parts of said second polysilicon layer forming lower and upper polysilicon regions, respectively, wherein the lower and upper polysilicon regions serve as lower and upper electrodes of said capacitor, respectively;

(k) partially exposing the first insulating layer from the second polysilicon layer in the second portion of the substructure;

(l) forming a second interlayer insulating layer over said entire substructure;

(m) forming second and third contact holes in said second interlayer insulating layer to form contact points to said lower and upper polysilicon regions, respectively.

\* \* \* \* \*